(12) United States Patent
Chen et al.

(10) Patent No.: US 11,024,824 B2
(45) Date of Patent: Jun. 1, 2021

(54) ORGANIC ELECTROLUMINESCENT DEVICES, DISPLAYS AND MOBILE COMMUNICATION APPARATUSES

(71) Applicant: KunShan Go-Visionox Opto-Electronics Co., Ltd., Kunshan (CN)

(72) Inventors: Zhaoli Chen, Jiangsu (CN); Jinfang Zhang, Jiangsu (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 36 days.

(21) Appl. No.: 16/426,096

(22) Filed: May 30, 2019

(65) Prior Publication Data

US 2019/0280240 A1    Sep. 12, 2019

Related U.S. Application Data

(63) Continuation of application No. PCT/CN2018/103545, filed on Aug. 31, 2018.

(30) Foreign Application Priority Data

Oct. 31, 2017   (CN) .......................... 201711049004.9

(51) Int. Cl.
  *H01L 51/52*   (2006.01)
  *H01L 51/50*   (2006.01)
  *H01L 27/32*   (2006.01)

(52) U.S. Cl.
  CPC ........ *H01L 51/5221* (2013.01); *H01L 27/329* (2013.01); *H01L 27/3276* (2013.01); *H01L 27/3279* (2013.01); *H01L 51/50* (2013.01)

(58) Field of Classification Search
  CPC . H01L 51/5221; H01L 51/50; H01L 27/3276; H01L 27/3279; H01L 27/329
  See application file for complete search history.

(56) References Cited

U.S. PATENT DOCUMENTS

| | | | |
|---|---|---|---|
| 10,734,466 B2 * | 8/2020 | Han | ................... H01L 27/3272 |
| 2002/0079503 A1 * | 6/2002 | Yamazaki | ........... H01L 27/3279 257/89 |

(Continued)

FOREIGN PATENT DOCUMENTS

| | | |
|---|---|---|
| CN | 102082162 A | 6/2011 |
| CN | 102082237 A | 6/2011 |
| CN | 102082238 A | 6/2011 |

(Continued)

OTHER PUBLICATIONS

CN 102130300 A _ Espacenet_English_Abstract.

(Continued)

*Primary Examiner* — Mark W Tornow
(74) *Attorney, Agent, or Firm* — Ladas & Party LLP (57) ABSTRACT

The application discloses an organic electroluminescent device. The organic electroluminescent device includes: a substrate; and an organic luminescent layer including an array of pixel points which include a first electrode, and the first electrode of the pixel points laps with a Vss lead. A length of the first electrode lapping with the Vss lead increases from a starting end of the Vss lead toward a terminating end of the Vss lead.

17 Claims, 4 Drawing Sheets

(56) References Cited

U.S. PATENT DOCUMENTS

2015/0187279 A1* 7/2015 Lee .................. H01L 51/56
                                                                        257/40
2017/0077212 A1* 3/2017 Li .................... H01L 51/0097

FOREIGN PATENT DOCUMENTS

| CN | 102130300 A | 7/2011 |
|----|-------------|--------|
| CN | 104011058 A | 8/2014 |
| CN | 106206989 A | 12/2016 |
| CN | 107004695 A | 8/2017 |
| CN | 107168574 A | 9/2017 |
| CN | 107887422 A | 4/2018 |
| TW | 201222807 A1 | 6/2012 |
| WO | 2013/160985 A1 | 10/2013 |

OTHER PUBLICATIONS

CN 102082237 A _ Espacenet_English_Abstract.
CN 102082162 A _ Espacenet_English_Abstract.
TW 201222807 A _ Espacenet_English_Abstract.
WO 2013/160985 A1 _ Espacenet_English_Abstract.
CN 106206989 A _Espacenet_English_Abstract.
CN 107004695 A _Espacenet_English_Abstract.
International Search Report in International Application No. PCT/CN2018/103545.
Written Opinion of the International Search Authority in International Application No. PCT/CN2018/103545.
CN 107887422 A _Espacenet_English_Abstract.
CN 102082238 A _Espacenet_English_Abstract.
CN 107168574 A _Espacenet_English_Abstract.
CN 104011058 A _Espacenet_English_Abstract.

* cited by examiner

ORGANIC ELECTROLUMINESCENT DEVICES, DISPLAYS AND MOBILE COMMUNICATION APPARATUSES

CROSS-REFERENCE TO RELATED APPLICATIONS

The application is a continuation application of international application No. PCT/CN2018/103545, filed on Aug. 31, 2018, which is based upon and claims priority to Chinese Patent Application No. 201711049004.9, filed on Oct. 31, 2017, with a title "ORGANIC ELECTROLUMINESCENT DEVICES, DISPLAYS AND MOBILE COMMUNICATION APPARATUSES", the entire contents of which are hereby incorporated by reference.

FIELD

The application relates to a field of organic electroluminescent devices.

BACKGROUND

For an existing display device, an Organic Light Emitting Diode (OLED for short), as a current-type luminescent device, is increasingly used in the field of high performance display owing to its various features, such as self-luminous, fast response, wide viewing angle, and fabricated on a flexible substrate.

SUMMARY

A technical problem to be solved by the application is a current attenuation problem for the signal of the organic electroluminescent device during transmission, especially the problem caused by the fact that a voltage value of a Vss lead is continuously reduced from a starting end to a terminating end. The application provides organic electroluminescent devices, displays, and mobile communication apparatuses thereof.

The above objects of the application can be achieved by the following technical solutions:

An organic electroluminescent device, including:
a substrate; and
an organic luminescent layer including an array of pixel points, the pixel points including a first electrode, and the first electrode of the pixel points lapping with a Vss lead;
a length of the first electrode lapping with the Vss lead increasing from a starting end of the Vss lead toward a terminating end of the Vss lead.

Optionally, the pixel points further include a second electrode, a conductive material is further arranged between the first electrode and the Vss lead, and the conductive material includes an anode material remained after the second electrode is patterned.

Optionally, a portion of the first electrode overlapping the Vss lead to form an overlapping region, and the Vss lead further includes a plurality of lapping portions and a connecting portion connected to the plurality of lapping portions, and the plurality of lapping portions are arranged at the overlapping region and spaced apart.

Optionally, a length of the plurality of lapping portions increases from the starting end of the Vss lead toward the terminating end of the Vss lead.

Optionally, the organic electroluminescent device further includes a planarization layer where the organic luminescent layer is arranged; the planarization layer having a plurality of openings, the first electrode being lapped with the Vss lead via the plurality of openings, and the length and/or width of the plurality of openings increases from the starting end of the Vss lead toward the terminating end of the Vss lead.

Optionally, the area of the plurality of openings increases from the starting end of the Vss lead toward the terminating end of the Vss lead of the substrate.

Optionally, the plurality of openings enable the plurality of lapping portions of the Vss lead to be exposed.

Optionally, an area of the plurality of lapping portions increases from the starting end of the Vss lead toward the terminating end of the Vss lead of the substrate.

Optionally, the first electrode is a cathode and the second electrode is an anode.

Optionally, an area of the plurality of lapping portions of the first electrode lapping with the Vss lead increases from the starting end of the Vss lead toward the terminating end of the Vss lead of the substrate.

An organic electroluminescent device, including:
a substrate;
an organic luminescent layer, including an array of pixel points, including a first electrode;
the organic luminescent layer being arranged on a planarization layer, the planarization layer having a plurality of openings through which the first electrode is lapped with the Vss lead to form a plurality of lapping portions,
a length or an area of the plurality of openings increasing from the starting end of the Vss lead to a terminating end of the Vss lead, the plurality of lapping portions being exposed from the plurality of openings such that the length or area of the lapping portions increases from the starting end of the Vss lead to the terminating end of the Vss lead.

Optionally, the pixel points further include a second electrode, a conductive material is further arranged between the first electrode and the Vss lead, and the conductive material includes an anode material remained after the second electrode is patterned.

The application also provides an organic electroluminescence display including a flexible printed circuit board and a power supply interface, the organic electroluminescence display including the above organic electroluminescent device.

The application also provides a mobile communication apparatus, including a communication device and a display device, the display device being above organic electroluminescent display.

Compared with the prior art, in the organic electroluminescent device of the application, by the means of increasing the length or area of the lapping portion from the starting end of the Vss lead toward the terminating end of the Vss lead mentioned above, a contact resistance of a first electrode of the pixel point and the Vss lead at the lapping portion can be reduced, the attenuation of the current during transmission can be reduced, and the problem of the voltage value of the Vss lead being continuously reduced from the starting end to the terminating end can be improved, and the problem of unevenness of the organic electroluminescent display can be optimized.

In the organic electroluminescent device of the application, by the means of increasing the length or area of the opening from the starting end of the Vss lead to the terminating end of the Vss lead, the length or area exposed from the lapping portion of the Vss lead can be relatively increased, the contact resistance at the lapping portion where the first electrode of the pixel point laps with the Vss lead can be reduced, the attenuation of current during transmission can be reduced, the problem that the voltage value of the Vss lead being continuously reduced from the starting end to the terminating end can be improved, and the problem of unevenness of the organic electroluminescence display can be optimized.

Certainly, implementing any of the products of the exemplary embodiments of the application does not necessarily require all of the technical effects described above to be achieved at the same time.

BRIEF DESCRIPTION OF THE DRAWINGS

The attached drawings shown here are intended to provide a further understanding of the application, and are intended to be a part of the application. The schematic exemplary embodiments of the application and the illustration thereof are intended to explain the application and are not construed to be a limitation to the application. In the drawings.

DETAILED DESCRIPTION

The exemplary embodiments of the application will be described in detail below with reference to the accompanying drawings and exemplary embodiments, thus how to solve the technical problems by the technical means and the implementation process to achieve the technical effect can be fully understood and implemented.

As OLEDs are used more broadly in display field, the size of an OLED display is relatively increased. However, as the size of the display increases, transmission lengths of various signals increase accordingly. However, a current driving the OLED is attenuated as a distance of a signal transmission length increases, thus a problem of uneven display occurs.

Figure 1:
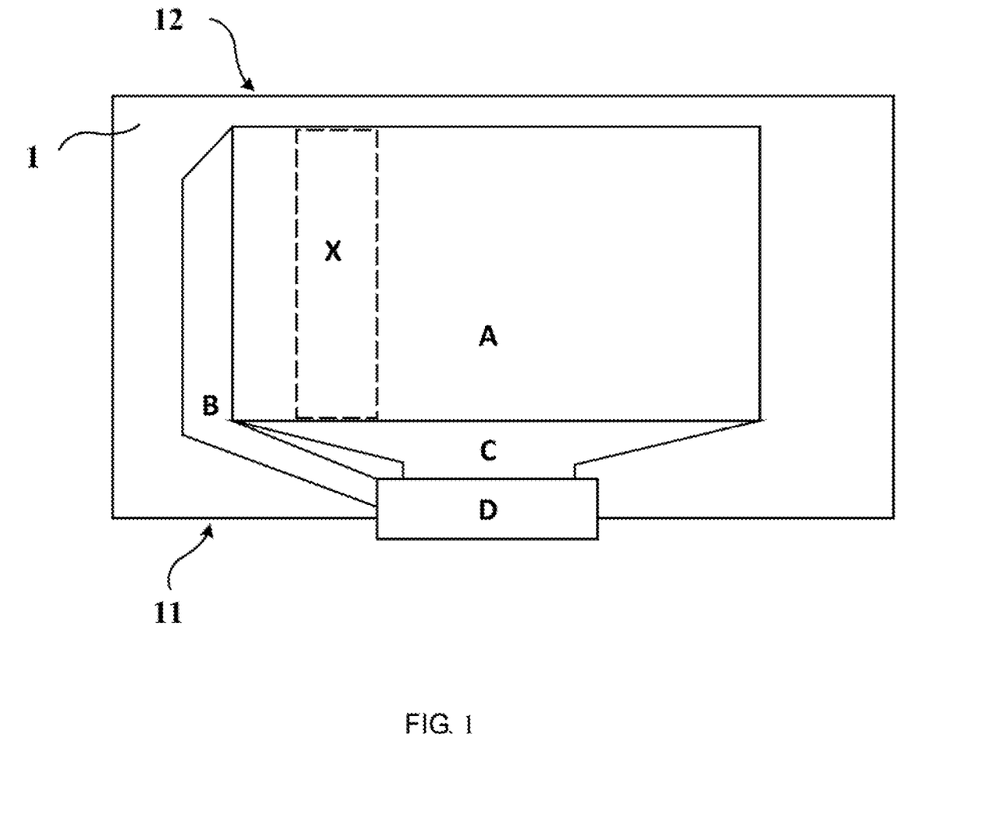
FIG. 1 is a schematic structural view of an organic electroluminescent device according to an exemplary embodiment of the application.

FIG. 1 is a schematic structural view of an organic electroluminescent device according to an exemplary embodiment of the present invention. A substrate 1 includes a display region A, a side lead region B, a lower lead region C, and an integrated circuit wiring region D. In the present exemplary embodiment, the substrate 1 has a first side 11 and a second side 12 being opposite to the first side 11. The display region A also includes an organic luminescent layer (not shown).

Figure 2:
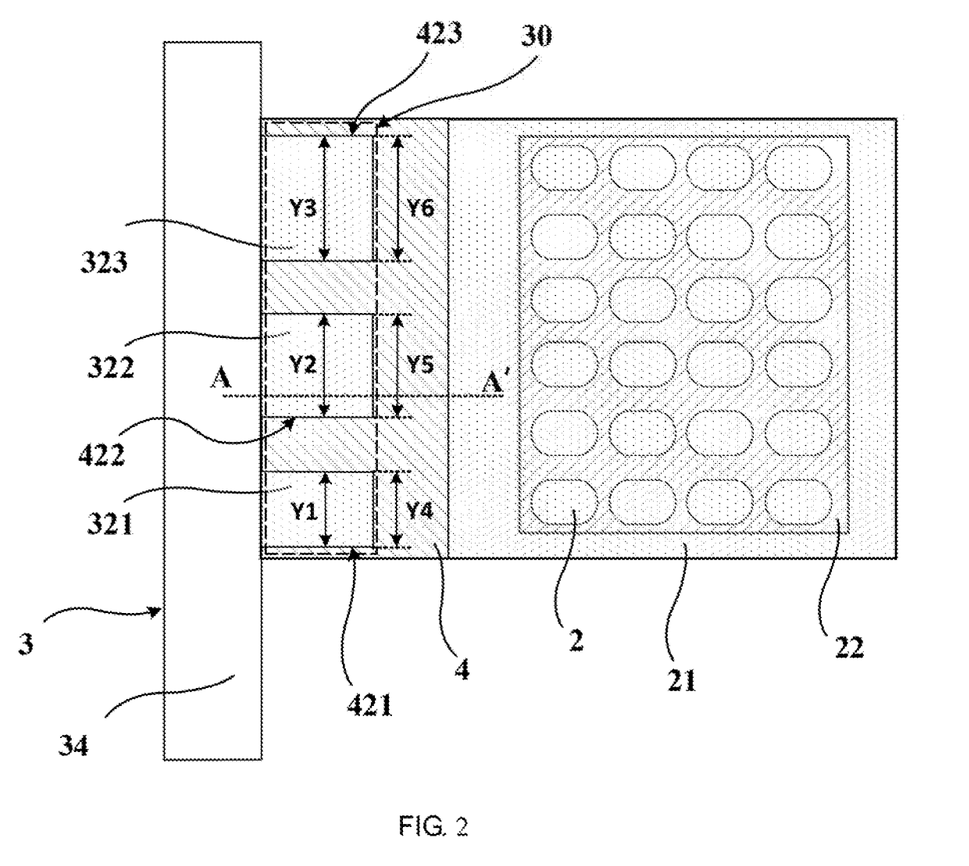
FIG. 2 is a partially enlarged schematic view showing the structure of an organic electroluminescent device according to an exemplary embodiment of the application.

FIG. 2 is a partially enlarged view showing the structure of an organic electroluminescent device according to an exemplary embodiment of the application.

Figure 3:
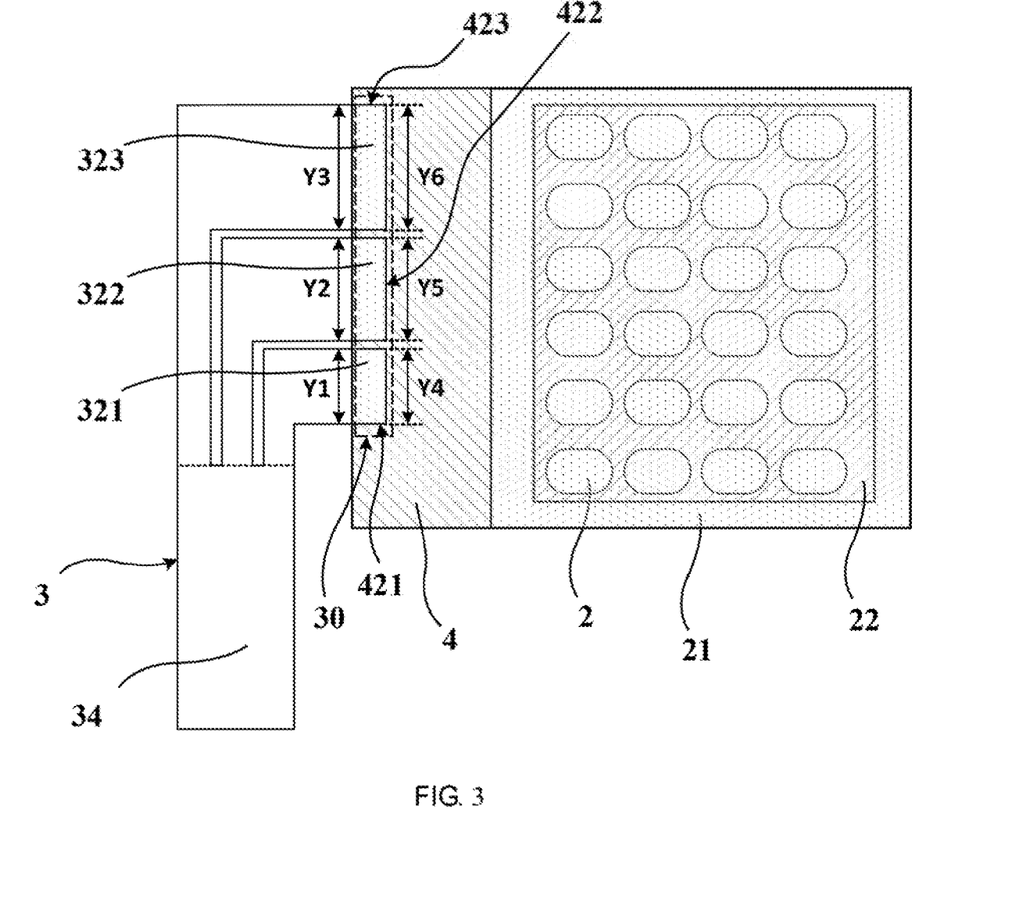
FIG. 3 is a partially enlarged schematic view showing the structure of an organic electroluminescent device according to another exemplary embodiment of the application.
Figure 4:
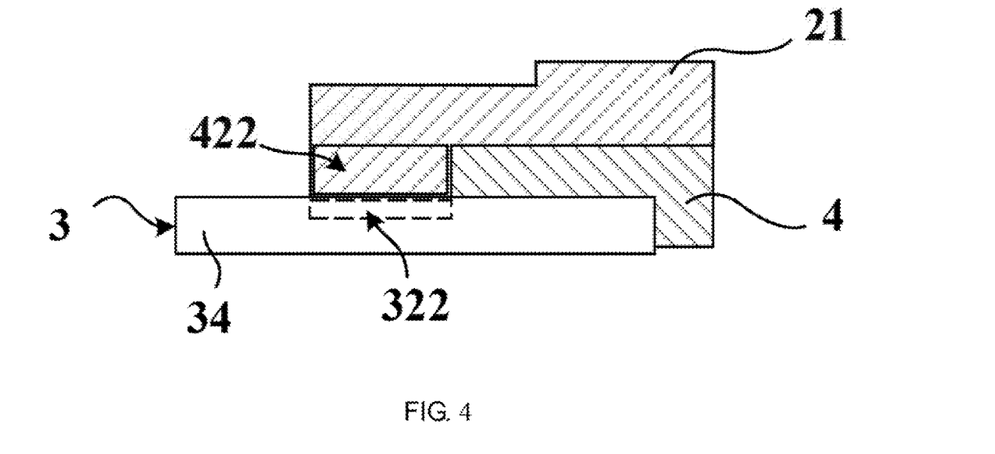
FIG. 4 is a cross-sectional view taken along the line A-A' of the structure of the organic electroluminescent device of the first exemplary embodiment of the application.
Figure 5:
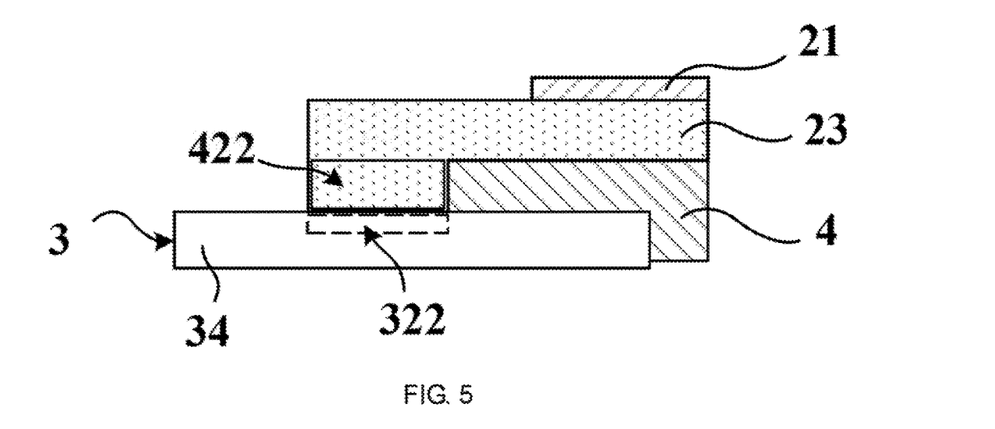
FIG. 5 is a cross-sectional view taken along the line A-A' of the structure of the organic electroluminescent device of the second exemplary embodiment of the application.

FIG. 3 is a partially enlarged view showing the structure of an organic electroluminescent device according to another exemplary embodiment of the application. The partial enlarged views of FIG. 2 and FIG. 3 are X region in the display region A shown in FIG. 1. FIG. 4 is a cross-sectional view taken along the line A-A' of the structure of the organic electroluminescent device of the first exemplary embodiment of the application. FIG. 5 is a cross-sectional view taken along the line A-A' of the structure of the organic electroluminescent device of the second exemplary embodiment of the application. The organic luminescent layer includes a plurality of pixel points 2 arranged in an array. The plurality of pixel points 2 further include a first electrode 21 and a second electrode 22 respectively for supplying current to the plurality of pixel points 2 to excite the plurality of pixel points 2. In an exemplary embodiment, the first electrode 21 may be a cathode and the second electrode 22 may be an anode.

Referring to the first exemplary embodiment of FIG. 4, the first electrode 21 of the plurality of pixel points 2 is lapped with the Vss lead 3 as shown in FIG. 4. Referring to the second exemplary embodiment of FIG. 5 together, as shown in FIG. 5, further, a conductive material 23 may be included between the first electrode 21 and the Vss lead 3. The conductive material 23 is an anode material which is retained after the second electrode 22 is patterned. However, the conductive material 23 is not conductive to the Vdd lead. The conductive material 23 is located between the first electrode 21 and the Vss lead 3 to electrically connect the first electrode 21 and the Vss lead 3.

Continue to refer to FIG. 2 and FIG. 3, in an exemplary embodiment, a region where the first electrode 21 of the organic luminescent layer overlaps with the Vss lead 3 is an overlapping region 30. The Vss lead 3 further includes a plurality of lapping portions, that is, a first lapping portion 321, a second lapping portion 322, a third lapping portion 323, and a connecting portion 34, and the plurality of lapping portions are connected to the connecting portion 34. The plurality of lapping portions are distributed in the overlapping region 30 and are spaced apart along the starting end of the Vss lead 3 toward the terminating end of the Vss lead 3. In one exemplary embodiment, the plurality of lapping portions are spaced apart along a first side 11 of the substrate 1 toward a second side 12 thereof, and the lengths of the sides of the plurality of lapping portions are gradually increased along the first side 11 of the substrate 1 as the starting end of the Vss lead 3 toward the second side 12 as the terminating end of the Vss lead 3. The first electrode 21 is connected to the plurality of lapping portions of the Vss lead 3 by overlapping which is also called lapping. The length of a lapping portion where the first electrode 21 laps with the Vss lead 3 is a length of the side where the first electrode 21 and the Vss lead 3 overlap on each other. Each of the lapping portions is a block where the first electrode 21 overlaps with the Vss lead 3. The organic electroluminescent device further includes a planarization layer 4 arranged on the pixel driving device layer, and an organic luminescent layer is arranged on the planarization layer 4. The planarization layer 4 has a plurality of openings, and the first electrode 21 of the organic luminescent layer laps with the plurality of lapping portions of the Vss leads 3 exposed from the plurality of openings.

Referring to FIG. 1 again, it should be noted that, in the above exemplary embodiment, the first side 11 and the second side 12 of the substrate 1 refer to both ends of a rectangular substrate, wherein the Vss lead 3 drawn from the integrated circuit wiring region D extends from the first side 11 as the starting end to the second side 12 as the terminating end. In addition, although the technical solution is described above by taking the rectangular substrate 1 as an example, when the substrate 1 is circular, elliptical or the like which does not explicitly include the first side 11 and the second side 12, please taking the following technical solution as a standard: a direction of the Vss lead 3 drawn from the integrated circuit chip extending from the starting end toward the terminating end. The same applies to the following exemplary embodiments, and therefore will not be described again.

Referring to FIG. 2 again, the exemplary embodiment disclosed in FIG. 2 will be described in detail below. In FIG. 2, the opening of the planarization layer 4 includes a first opening 421, a second opening 422 and a third opening 423, but the number of openings of the planarization layer 4 of the application is not limited thereto. The Vss lead 3 located in the first opening 421 is the first lapping portion 321, the Vss lead 3 located in the second opening 422 is the second lapping portion 322, and the Vss lead 3 located in the third opening 423 is the third lapping portion 323. The Vss lead 3 outside the first lapping portion 321, the second lapping portion 322, and the third lapping portion 323 is the connecting portion 34. In one exemplary embodiment, since the lengths of the first opening 421, the second opening 422, and the third opening 423 are different, the lengths of the first lapping portion 321, the second lapping portion 322, and the third lapping portion 323 are different. The first opening 421, the second opening 422 and the third opening 423 are sequentially arranged along the first side 11 of the substrate 1 as the starting end of the Vss lead 3 toward the second side 12 of the substrate 1 as the terminating end of the Vss lead 3, that is, the first opening 421 is adjacent to the first side 11 of the substrate 1, and the third opening 423 is adjacent to the second side 12 of the substrate 1, so the first lapping portion 321, the second lapping portion 322 and the third lapping portion 323 are also sequentially arranged along the first side 11 of the substrate 1 toward the second side 12 thereof. The lengths of the sides of the first opening 421, the second opening 422 and the third opening 423 are gradually increased along the first side 11 of the substrate 1 as the starting end of the Vss lead 3 toward the second side 12 of the substrate 1 as the terminating end of the Vss lead 3, so the lengths of the sides of the first lapping portion 321, the second lapping portion 322 and the third lapping portion 323 are gradually increased r along the first side 11 of the substrate 1 as the starting end of the Vss lead 3 toward the second side 12 of the substrate 1 as the terminating end of the Vss lead 3.

In an exemplary embodiment, referring to FIG. 2 again, a length of the first opening 421 is Y4, a length of the second opening 422 is Y5, a length of the third opening 423 is Y6, and the length Y4 of the first opening 421 is smaller than the length Y5 of the second opening 422. The length Y5 of the second opening 422 is smaller than the length Y6 of the third opening 423. The lengths of the plurality of openings are gradually increased from the first side 11 of the substrate 1 performing as the starting end of the Vss lead 3 toward the second side 12 of the substrate 1 performing as the terminating end of the Vss lead 3. Therefore, the length of the first lapping portion 321 is Y1 which is equal to the length Y4 of the first opening 421. The length of the second lapping portion 322 is Y2 which is equal to the length Y5 of the second opening 422. The length of the third lapping portion 323 is Y3 equal to the length Y6 of the third opening 423. Since the length Y4 of the first opening 421 is smaller than the length Y5 of the second opening 422, the length Y5 of the second opening 422 is smaller than the length Y6 of the third opening 423, the length Y1 of the first lapping portion 321 is smaller than the length Y2 of the second lapping portion 322, the length Y2 of the second lapping portion 322 is smaller than the length Y3 of the third lapping portion, thus the lengths of the sides of the plurality of lapping portions are increased from the first side 11 of the substrate 1 performing as the starting end of the Vss lead 3 toward the second side 12 of the substrate 1 performing as the terminating end of the Vss lead 3.

As can be seen from the above, when the length of each opening is changed and the width thereof remains constant, the area of each opening is certainly increased, so that the area of the exposed lapping portion is also relatively increased, and thus the area of the plurality of openings is increased from the first side 11 of the substrate 1 performing as the starting end of the Vss lead 3 toward the second side 12 of the substrate 1 performing as the terminating end of the Vss lead 3. In another exemplary embodiment of the application, the area of the plurality of the openings of the planarization layer 4 may also be increased by merely changing the width of each opening or simultaneously changing the length and width of the sides of each opening. The organic electroluminescent device of the application, by the means of increasing the length or area of the opening 42 from the starting end of the Vss lead 3 toward the terminating end of the Vss lead 3 mentioned above, enables an increased length or an increased area of the lapping portions exposed from the plurality of the lapping portions of the Vss lead 3, thus the contact resistance of the first electrode 21 of the plurality of pixel points 2 and the Vss lead 3 at the lapping portion can be reduced, the attenuation of the current during transmission can be reduced, and the problem of the voltage value of the Vss lead 3 being continuously reduced from the starting end to the terminating end can be improved, and the problem of unevenness of the organic electroluminescent display can be optimized. The difference between the Vss lead 3 shown in FIG. 2 and the Vss lead 3 shown in FIG. 3 is the connection structure of the connecting portion 34 of the Vss lead 3 and the plurality of lapping portions, and details are not described herein again.

In the above exemplary embodiment, the planarization layer 4 is arranged between the pixel driving device layer and the organic luminescent layer. In other exemplary embodiments, the planarization layer 4 may be omitted. Thus, the first electrode 21 directly laps with the plurality of lapping portions. As the length of the plurality of lapping portions increases, the area of the lapping portion naturally increases when the depth or width of the lapping portion does not change, so that the area of the plurality of the lapping portions of the first electrode 21 of the plurality of pixel points 2 and the Vss lead 3 increases from the starting end of the Vss lead 3 toward the terminating end of the Vss lead 3. In another exemplary embodiment of the application, the area of the plurality of lapping portions can be increased by changing the width of the lapping portions. In the organic electroluminescent device of the application, by means of increasing the length or area of the lapping portion from the starting end of the Vss lead 3 to the terminating end of the Vss lead 3, the contact resistance of the first electrode 21 of the pixel 2 and the Vss lead 3 at the lapping portion can be reduced, the attenuation of the current during transmission can be reduced, the problem that the voltage value of the Vss lead 3 being continuously reduced from the starting end to the terminating end can be improved, and the problem of unevenness of the organic electroluminescence display can be optimized.

Based on this, an exemplary embodiment of the application further proposes an organic electroluminescent display, including a flexible printed circuit board (FPC) and a power supply interface. The organic electroluminescent display uses the aforementioned organic electroluminescent device. At the same time, a mobile communication apparatus is proposed, including a communication device and a display device, and the display device is the aforementioned organic electroluminescent display.

It should also be noted that the terms "including", "comprising" or any other variations thereof are intended to encompass a non-exclusive inclusion, such that the item or system comprising a plurality of elements includes not only those elements but also other elements that are not explicitly listed, or elements that are inherent to such items or systems. In the case without further limitation, an element defined by the phrase "comprising a . . . " does not exclude the presence of additional identical elements in the item or system.

The above description shows and describes certain preferred exemplary embodiments of the application, but as described above, it should be understood that the application is not limited to the forms disclosed herein, and should not be construed as an exclusion to other exemplary embodiments and may be applied to other combinations, modifications, and environments, thus can be modified by the above-mentioned teaching or technology or knowledge in related fields within the scope of the concepts herein. All changes and modifications made by a person skilled in the art are intended to be within the scope of the appended claims.

What is claimed is:

1. An organic electroluminescent device, comprising:
a substrate; and
an organic luminescent layer comprising an array of pixel points, the pixel points comprising a first electrode, and the first electrode of the pixel points lapping with a Vss lead;
a length of the first electrode lapping with the Vss lead increasing from a starting end of the Vss lead toward a terminating end of the Vss lead,
wherein a portion of the first electrode overlaps with the Vss lead to form an overlapping region, and the Vss lead further comprises a plurality of lapping portions and a connecting portion connected to the plurality of lapping portions, and the plurality of lapping portions are arranged at the overlapping region and spaced apart, and
wherein a length of the plurality of lapping portions increases from the starting end of the Vss lead toward the terminating end of the Vss lead,
said organic electroluminescent device further comprising a planarization layer where the organic luminescent layer is arranged; the planarization layer having a plurality of openings, the first electrode being lapped with the Vss lead via the plurality of openings, and a length and/or a width of the plurality of openings increases from the starting end of the Vss lead toward the terminating end of the Vss lead.

2. The organic electroluminescent device according to claim 1, wherein the pixel points further comprise a second electrode, a conductive material is further arranged between the first electrode and the Vss lead, and the conductive material comprises an anode material remained after the second electrode is patterned.

3. The organic electroluminescent device according to claim 2, wherein the first electrode is a cathode and the second electrode is an anode.

4. An organic electroluminescent device according to claim 1, wherein an area of the plurality of openings increases from the starting end of the Vss lead toward the terminating end of the Vss lead of the substrate.

5. The organic electroluminescent device according to claim 1, wherein the plurality of openings enable the plurality of lapping portions of the Vss lead to be exposed.

6. The organic electroluminescent device according to claim 1, wherein an area of the plurality of lapping portions increases from the starting end of the Vss lead toward the terminating end of the Vss lead.

7. The organic electroluminescent device according to claim 1, wherein an area of the plurality of lapping portions of the first electrode lapping with the Vss lead increases from the starting end of the Vss lead toward the terminating end of the Vss lead.

8. An organic electroluminescence display comprising a flexible printed circuit board and a power supply interface, the display further comprising the organic electroluminescent device according to claim 1.

9. The organic electroluminescent device according to claim 1, wherein the plurality of lapping portions comprises a first lapping portion, a second lapping portion and a third lapping portion; wherein lengths of the first lapping portion, the second lapping portion, and the third lapping portion are different.

10. The organic electroluminescent device according to claim 9, wherein the lengths of the first lapping portion, the second lapping portion, and the third lapping portion are gradually increased along a first side of the substrate as the starting end of the Vss lead toward a second side as the terminating end of the Vss lead.

11. The organic electroluminescent device according to claim 9, wherein a length of the first lapping portion is smaller than a length of the second lapping portion, and a length of the second lapping portion is smaller than a length of the third lapping portion.

12. The organic electroluminescent device according to claim 9, wherein the plurality of openings comprises a first opening, a second opening, and a third opening; lengths of the first opening, the second opening, and the third opening are different.

13. The organic electroluminescent device according to claim 12, wherein the first opening, the second opening, and the third opening are sequentially arranged along a first side of the substrate as the starting end of the Vss lead toward a second side of the substrate as the terminating end of the Vss lead; lengths of the first opening, the second opening, and the third opening are gradually increased along the first side of the substrate as the starting end of the Vss lead toward the second side of the substrate as the terminating end of the Vss lead.

14. The organic electroluminescent device according to claim 13, wherein a portion of Vss lead located in the first opening is the first lapping portion, a portion of the Vss lead located in the second opening is the second lapping portion, and a portion of the Vss lead located in the third opening is the third lapping portion; a portion of the Vss lead outside the first lapping portion, the second lapping portion, and the third lapping portion is the connecting portion.

15. An organic electroluminescent device, comprising:
a substrate;
an organic luminescent layer, comprising an array of pixel points comprising a first electrode, and the first electrode of the pixel points lapping with a Vss lead; wherein a portion of the first electrode overlaps with the Vss lead to form an overlapping region, and the Vss lead further comprises a plurality of lapping portions and a connecting portion connected to the plurality of lapping portions, and the plurality of lapping portions are arranged at the overlapping region and spaced apart, the organic luminescent layer being arranged on a planarization layer, the planarization layer having a plurality of openings through which the first electrode is lapped with the Vss lead to form a plurality of lapping portions, a length or an area of the plurality of openings increasing from a starting end of the Vss lead to a terminating end of the Vss lead, the plurality of lapping portions being exposed from the plurality of openings such that the length or area of the lapping portions increases from the starting end of the Vss lead to the terminating end of the Vss lead.

16. The organic electroluminescent device according to claim 15, wherein the pixel points further comprise a second electrode, a conductive material is further arranged between the first electrode and the Vss lead, and the conductive material comprises an anode material remained after the second electrode is patterned.

17. The organic electroluminescent device according to claim 15, wherein the plurality of lapping portions comprises a first lapping portion, a second lapping portion, and a third lapping portion; lengths of the first lapping portion, the second lapping portion, and the third lapping portion are gradually increased along a first side of the substrate as the starting end of the Vss lead toward a second side as the terminating end of the Vss lead; the plurality of openings comprises a first opening, a second opening, and a third opening; lengths of the first opening, the second opening, and the third opening are gradually increased along the first side of the substrate as the starting end of the Vss lead toward the second side of the substrate as the terminating end of the Vss lead.

* * * * *